(12) United States Patent
Hertz et al.

(10) Patent No.: US 6,760,406 B2
(45) Date of Patent: Jul. 6, 2004

(54) METHOD AND APPARATUS FOR GENERATING X-RAY OR EUV RADIATION

(75) Inventors: Hans Martin Hertz, Stocksund (SE); Oscar Hemberg, Stockholm (SE); Lars Rymell, Stockholm (SE); Björn A.M. Hansson, Stockholm (SE); Magnus Berglund, Axeltorp (SE)

(73) Assignee: Jettec AB, Stocksund (SE)

(*) Notice: Subject to any disclaimer, the term of this patent is extended or adjusted under 35 U.S.C. 154(b) by 209 days.

(21) Appl. No.: 09/974,975

(22) Filed: Oct. 12, 2001

(65) Prior Publication Data

US 2002/0044629 A1 Apr. 18, 2002

Related U.S. Application Data

(60) Provisional application No. 60/239,896, filed on Oct. 13, 2000.

(51) Int. Cl.[7] .................................................. H01J 35/00
(52) U.S. Cl. ..................................... 378/119; 250/504 R
(58) Field of Search ................................ 378/119, 122; 250/504 R

(56) References Cited

U.S. PATENT DOCUMENTS

| 5,577,092 | A | | 11/1996 | Kublak et al. |
| 6,002,744 | A | | 12/1999 | Hertz et al. |
| 6,190,835 | B1 | * | 2/2001 | Haas et al. ................. 430/311 |
| 6,504,903 | B1 | * | 1/2003 | Kondo et al. ............... 378/119 |
| 6,552,350 | B2 | * | 4/2003 | Haas et al. ................. 250/365 |

FOREIGN PATENT DOCUMENTS

| WO | WO 97/40650 | 10/1997 |

* cited by examiner

Primary Examiner—Craig E. Church
Assistant Examiner—Jurie Yun
(74) Attorney, Agent, or Firm—Burns, Doane, Swecker & Mathis, L.L.P.

(57) ABSTRACT

In a method of generating X-ray or EUV radiation, a substance is urged through an outlet to generate a jet in a direction from the outlet, at least one energy beam is directed onto the jet, the energy beam interacting with the jet to generate the X-ray or EUV radiation, and the temperature of the outlet is controlled, such that the stability of the jet is improved. An apparatus is also disclosed.

33 Claims, 2 Drawing Sheets

METHOD AND APPARATUS FOR GENERATING X-RAY OR EUV RADIATION

This application claims priority under 35 U.S.C. §119 to U.S. Provisional Application No. 60/239,896 filed on Oct. 13, 2000.

TECHNICAL FIELD

The present invention generally relates to a method and an apparatus for generating X-ray or EUV radiation, i.e. radiation in the wavelength region of approximately 0.01–100 nm. The generated radiation can be used in any application requiring X-ray or EUV radiation, for example lithography, microscopy, materials science, or medical diagnostics.

BACKGROUND ART

EUV and X-ray sources of high intensity are applied in many fields, for instance surface physics, materials testing, crystal analysis, atomic physics, medical diagnostics, lithography and microscopy. Conventional X-ray sources, in which an electron beam is brought to impinge on an anode, generate a relatively low X-ray intensity. Large facilities, such as synchrotron light sources, produce a high average power. However, there are many applications that require compact, small-scale systems which produce a relatively high average power. Compact and more inexpensive systems yield better accessibility to the applied user and thus are of potentially greater value to science and society. An example of an application of particular industrial importance is future narrow-line-width lithography systems.

Ever since the 1960s, the size of the structures that constitute the basis of integrated electronic circuits has decreased continuously. The advantage thereof is faster and more complicated circuits needing less power. At present, photolithography is used to industrially produce such circuits having a line width of about 0.18 $\mu$m with projected extension towards 0.10–0.13 $\mu$m. In order to further reduce the line width, other methods will probably be necessary, of which EUV projection lithography is a very interesting candidate and X-ray lithography may become interesting for certain technological niches. In EUV projection lithography, use is made of a reducing extreme ultraviolet (EUV) objective system in the wavelength range around 10–20 nm ("EUV Lithography—The Successor to Optical Lithography?" by Bjorkholm, published in Intel Technology Journal Q3'98). Proximity X-ray lithography, employing a contact copy scheme, is carried out in the wavelength range around 1 nm (see for instance the article "X-ray Lithography" by Maldonado, published in J. Electronic Materials 19, p. 699, 1990).

Laser plasmas are attractive table-top X-ray and EUV sources due to their high brightness, high spatial stability and, potentially, high-repetition rate However, with conventional bulk or tape targets, the operating time is limited, especially when high-repetition-rate lasers are used, since fresh target material cannot be supplied at a sufficient rate. Furthermore, such conventional targets produce debris which may destroy or coat sensitive components such as X-ray optics or EUV multilayer mirrors positioned close to the plasma. Several methods have been designed to eliminate the effect of debris, i.e., preventing the already produced debris from reaching the sensitive components. As an alternative, the amount of debris actually produced can be limited by replacing conventional solid targets with for example gas targets, gas-cluster targets, liquid-droplet targets, or liquid-jet targets.

Targets in the form of microscopic liquid droplets, such as disclosed in the article "Droplet target for low-debris laser-plasma soft X-ray generation" by Rymell and Hertz, published in Opt. Commun. 103, p. 105, 1993, are attractive low-debris, high-density targets potentially capable of high repetition-rate laser-plasma operation with high-brightness emission. Such droplets are generated by stimulated breakup of a liquid jet which is formed at a nozzle in a low-pressure chamber. However, the hydrodynamic properties of certain fluids result in unstable drop formation. Furthermore, the operation of the laser must be carefully synchronized with the droplet formation. Another problem may arise in the use of liquid substances with rapid evaporation, namely that the jet freezes immediately upon generation so that drops cannot be formed. Such substances primarily include media that are in a gaseous state at normal pressure and temperature and that are cooled to a liquid state for generation of the droplet targets. To ensure droplet formation, it is necessary to provide a suitable gas atmosphere in the low-pressure chamber, or to raise the temperature of the jet above its freezing temperature by means of an electric heater provided around the jet, such as disclosed in the article "Apparatus for producing uniform solid spheres of hydrogen" by Foster et al., published in Rev. Sci. Instrum. 6, pp. 625–631, 1977.

As an alternative, as known from U.S. Pat. No. 6,002,744, which is incorporated herein by reference, the laser radiation is instead focused on a spatially continuous portion of a jet which is generated by urging a liquid substance through an outlet or nozzle. This liquid-jet approach alleviates the need for temporal synchronization of the laser with the generation of the target, while keeping the production of debris equally low as from droplet targets. Furthermore, liquid substances having unsuitable hydrodynamic properties for droplet formation can be used in this approach. Another advantage over the droplet-target approach is that the spatially continuous portion of the jet can be allowed to freeze. Such a liquid-jet laser-plasma source has been further demonstrated in the article "Cryogenic liquid-jet target for debris-free laser-plasma soft x-ray generation" by Berglund et al, published in Rev. Sci. Instrum. 69, p. 2361, 1998, and the article "Liquid-jet target laser-plasma sources for EUV and X-ray lithography" by Rymell et al, published in Microelectronic Engineering 46, p. 453, 1999, by using liquid nitrogen and xenon, respectively, as target material. In these cases, a high-density target is formed as a spatially continuous portion of the jet, wherein the spatially continuous portion can be in a liquid or a frozen state. Such laser-plasma sources have the advantage of being high-brightness, low-debris sources capable of continuous high-repetition-rate operation, and the plasma can be produced far from the outlet orifice, thereby limiting plasma-induced erosion of the outlet. Such erosion may be a source of damaging debris. Further, by producing the plasma far from the outlet, self-absorption of the generated radiation can be minimized. This is due to the fact that the temperature around the jet decreases with the distance from the outlet, resulting in a correspondingly decreasing evaporation rate. Thus, the local gas atmosphere around the jet also decreases with the distance from the outlet.

However, many substances, and in particular liquid substances formed by cooling normally gaseous substances, yield a jet that experiences stochastic changes in its direction from the jet-generating outlet. Typically the change in direction can be as large as about ±1° and occurs a few times per minute to a few times per second. This in turn results in a spatial instability at the focus of the laser beam, i.e. at the desired area of beam-jet-interaction, which should be as far away from the outlet orifice as possible for the reasons given above. The spatial instability leads to high pulse-to-pulse fluctuations in the emitted X-ray and EUV radiation flux and spatial instability of the radiating plasma. Furthermore, the average power is significantly lowered.

SUMMARY OF THE INVENTION

It is therefore an object of the present invention to provide a method and an apparatus for stable and uncomplicated generation of X-ray or EUV radiation. More specifically, the invention should provide for low pulse-to-pulse fluctuations in the generated X-ray or EUV radiation flux, low erosion of the jet-generating outlet, as well as low self-absorption of the generated radiation.

It is also an object to provide an apparatus for generating X-ray or EUV radiation that is compact, inexpensive, generates radiation at a relatively high average power and has a minimum production of debris.

A further object is to provide a method and an apparatus which produces X-ray or EUV radiation which is suitable for EUV projection lithography and proximity lithography.

One more object of the invention is to permit use of the method and the apparatus in microscopy, materials science, biomedical and medical diagnostics.

These and other objects, which will be apparent from the following specification, are wholly or partially achieved by the method and the apparatus according to the independent claims. The dependent claims define preferred embodiments.

It has been found that controlling the temperature of the outlet, normally heating the same, has the effect of considerably improving the directional stability of the generated jet. Thus, the invention allows for low pulse-to-pulse fluctuations in the generated X-ray or EUV radiation flux, increased average power, as well as increased spatial stability of the radiating beam-jet-interaction area. The directionally stable jet also allows for a large distance between the outlet and the beam-jet-interaction area, thereby minimizing both erosion of the outlet and self-absorption of the generated radiation. A "large distance" in this context is typically at least a few millimeters. In view of the large distance made possible by the invention, the power of the energy beam might be increased without causing undesired heating of the target generator. Thus, the invention allows for a higher X-ray and EUV flux. Further, the invention allows for use of several new substances and, thus, for stable generation of radiation in new wavelength ranges.

These advantages are obtained while retaining many of the advantages of the prior art technologies, as discussed by way of introduction, for example a great reduction of debris, excellent geometric access, a possibility of long-term operation without interruption by providing new target material continuously through the jet, a possibility of using lasers of high repetition rates, which increases the average power of the generated X-ray or EUV radiation.

The inventive control of the temperature of the outlet should preferably be effected with minimum influence on the temperature of the substance inside the jet-generating outlet, since such influence might cause boiling or a modification of the hydrodynamic properties of the substance, which potentially might lead to instabilities in the generation of the jet, for example potentially undesired spray formation.

According to one preferred embodiment, the temperature of the outlet is controlled by means of ohmic heating, for example by applying a voltage to an electrically conducting resistive wire arranged around and preferably in contact with the outlet, or by applying the voltage to a portion of the outlet itself. This embodiment is advantageous in its simplicity and ruggedness. By means of thin wires or evaporated electrodes it is possible to localize the generated heat close to the outlet opening.

According to another preferred embodiment, the temperature of the outlet is controlled by directing radiation energy, for example laser radiation or microwaves, onto the outlet which is heated by absorption of this radiation energy. This embodiment provides for non-intrusive heating of the outlet, in that no new material needs to be mechanically introduced at the outlet, and can be precisely controlled to heat only the outlet opening, if desired. Preferably, the outlet is treated for enhanced and/or more localized absorption of the radiation energy, for example by providing an absorbing or conducting arrangement, such as a coating or an antenna, on the outlet.

Without committing oneself to a theory, it is assumed that the results regarding the improved directional stability of the generated jet can be explained by the following model. When the substance leaves the outlet, the thus-formed jet, as well as any liquid wetting the outlet, undergoes evaporative cooling. This results in the outlet being cooled, leading to uncontrolled deposition of frozen material on, or close to, the outlet orifice. Such frozen material could induce the stochastic directional instability described above. Heating of the outlet is believed to minimize such deposition of frozen material.

According to a further preferred embodiment of the invention, the jet leaves the outlet in a condensed, i.e. liquid or frozen, state. This allows for collimated transport of target material far from the outlet. To form such a jet of condensed matter, it is preferred to urge a substance in a liquid state through the jet-forming outlet. The substance used in the invention could be a medium which is in a liquid state both at room temperature and the temperature prevailing at the generation of the jet. This medium could also be a solution comprising solids and a suitable carrier fluid. In a particularly preferred embodiment, however, the substance is a medium which is in a gaseous state at room temperature, but which is cooled to a liquid state before being urged through the outlet to form the jet. This type of medium can, by means of the invention, be used in an uncomplicated way for stable generation of X-ray or EUV radiation at previously unaccessible wavelengths. By using an inert gas, in particular a noble gas, the damages caused by debris can be reduced significantly.

It should be noted, however, that the jet can be in any suitable state (gaseous, liquid, or solid) when interacting with the energy beam.

According to one embodiment of the invention, the energy beam is directed onto a spatially continuous portion of the jet. This can be achieved, for instance, by generating a spatially completely continuous jet, and by directing the energy beam onto the actual jet before it spontaneously breaks up into droplets or a spray. Alternatively, it is conceivable to generate a pulsed or semicontinuous jet consisting of separate, spatially continuous portions each having a length that significantly exceeds the diameter. In both cases, the jet might be frozen due to evaporative cooling before interacting with the energy beam.

An alternative embodiment include directing the energy beam onto one or more droplets, or a spray, which could be formed spontaneously, or by stimulation, from the jet.

Thus, the energy beam can, within the scope of the invention, interact with any formation emanating from the jet, be it gaseous, liquid or solid, spatially continuous, droplets, or a spray of droplets or clusters.

The energy beam is preferably a beam of electromagnetic radiation, such as laser radiation, which interacts with the jet and heats it to a plasma-forming temperature. It is also conceivable to use a beam of electrons as energy beam, wherein EUV or X-ray radiation is generated either by the electrons heating the jet to a plasma-forming temperature, or by direct conversion of the electron-beam energy to Bremsstrahlung and characteristic line emission, essentially without the need of heating the jet to a plasma-forming temperature.

The present invention is based on the need for compact and intensive X-ray or EUV sources for, inter alia, lithography, microscopy, materials science and medical diagnostics. Wavelength ranges of particular interest for such applications are approximately 1–2 nm (proximity lithography), 2.3–4.4 nm (X-ray microscopy), 10–15 nm (EUV projection lithography) and 0.01–20 nm (materials science, for instance photoelectron spectroscopy or X-ray fluorescence, or biomedical applications such as X-ray diffraction or medical diagnostics). The generation of radiation in these wavelength ranges with high conversion efficiency by means of laser-produced plasma generally necessitates laser intensities around $10^{10}$–$10^{15}$ W/cm$^2$. In order to achieve such intensities with compact laser systems, the laser radiation is focused to a diameter of about five to a few hundred micrometers. Thus, the target can be made microscopic, provided that it is spatially stable. The small dimensions contribute to effective utilization of the target material, which, among other things, results in a drastic reduction of debris. By using short-pulsed laser radiation, for example in the femtosecond range, harder X-rays may be generated.

The method and apparatus according to the invention is particularly, but not exclusively, suited for EUV projection lithography which requires irradiation in the wavelength range of approximately 10–15 nm. Such radiation can be generated, by means of the invention, by using xenon as target material.

By using different target materials in a method or an apparatus according to the invention, EUV and X-ray radiation can be generated at suitable wavelengths for a number of different applications. Examples of such applications are X-ray microscopy, materials science (e.g. photoelectron microscopy and X-ray fluorescence), EUV projection lithography, proximity X-ray lithography, medical X-ray diagnostics or crystal analysis.

BRIEF DESCRIPTION OF THE DRAWINGS

The invention will now be described for the purpose of exemplification with reference to the accompanying schematic drawings, which illustrate a currently preferred embodiment and in which.

DESCRIPTION OF PREFERRED EMBODIMENTS

Figure 1:
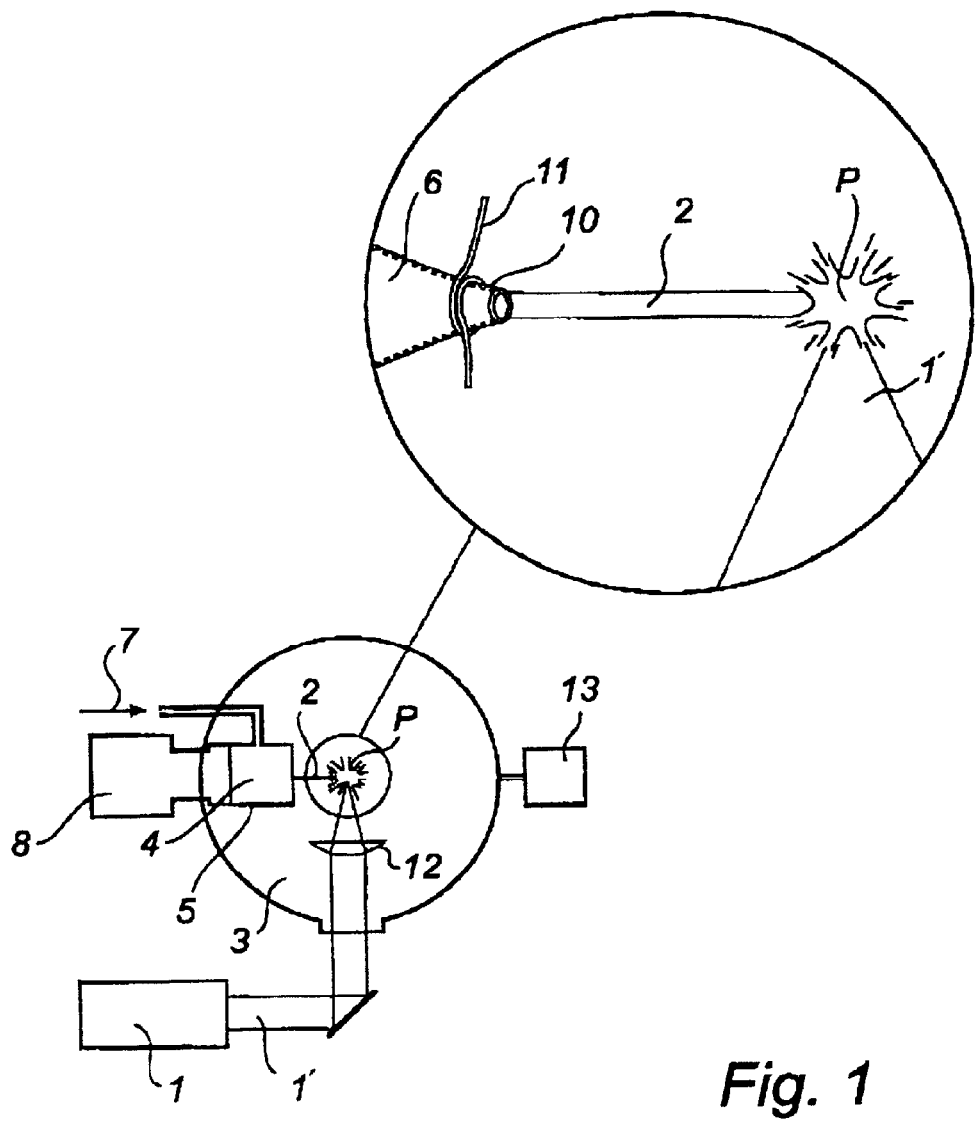
FIG. 1 illustrates a preferred embodiment of the inventive apparatus for generating X-ray or EUV radiation from a stable jet in a low-pressure chamber employing ohmic heating close to the nozzle orifice.

The method and the apparatus according to the invention are basically illustrated in FIG. 1. Below, xenon is used as an example but the invention may be operated with many other substances, of which liquefied gases are believed to be the most important, as discussed in the end of this section.

A laser 1 generates one or more pulsed laser beams 1' that are focused from one or more directions on a jet 2 of liquefied xenon liquid, which serves as target. For reasons of clarity, only one laser beam 1' is shown in FIG. 1. The beam-jet-interaction produces a plasma P emitting the desired X-ray and EUV radiation. The actual production of X-rays usually takes place at low pressure, to prevent emitted soft X-ray or EUV radiation from being absorbed. For certain X-ray or EUV wavelengths, the laser-plasma production may be operated in a gaseous environment. This gaseous environment may be local around the area of beam-jet-interaction. Low pressure is often preferable to eliminate laser-induced breakdowns in front of the jet 2 or to reduce self-absorption of the emitted radiation.

The microscopic jet 2 of liquid xenon is spatially continuous and is formed in a vacuum chamber 3, as shown in FIG. 1. In general, liquid xenon 4 is urged under high pressure (usually 5–500 atmospheres) from a pump (not shown) or a pressure vessel 5 through a small nozzle 6 having an orifice diameter which usually is smaller than about 100 μm and typically a few to up to a few tens of micrometers. This results in a microscopic jet 2 of liquid of essentially the same diameter as the orifice diameter and with a speed of about ten m/s to a few hundred m/s. In one arrangement (not shown), the liquid xenon is produced separately and then forced through the nozzle by a pump or other pressure-producing arrangement. Alternatively, as shown in FIG. 1, the pressure of gaseous xenon 7 itself is used as the driver. Here, xenon gas is forced at a pressure of about 5–100 bar into the pressure vessel 5 which is cooled to about 160–200 K by a Gifford-McMahon-type or other cold head 8. The glass capillary nozzle 6 is attached directly to the pressure vessel 5, producing the microscopic jet 2 of liquid xenon in the low-pressure chamber 3.

The laser beam 1' is controlled to interact with the spatially continuous jet 2. For most liquids, the jet 2 propagates in the chamber 3 in a given direction towards a break-up point (not shown), at which it should spontaneously separate into droplets or a spray. In the exemplifying embodiment shown in FIG. 1, the laser beam 1' is focused on the jet 2 upstream of any such break-up point. For many cryogenic liquids, such as xenon, the jet 2 is rapidly cooled by evaporation as it leaves the nozzle 6, and in many cases the jet 2 freezes close to the nozzle 6 so that no droplets are formed. In that case, the laser beam 1' could be focused on a spatially continuous portion of the thus frozen jet 2.

For generation of X-ray emission in the wavelength range around 1–5 nm, a laser intensity of about $10^{12}$–$10^{15}$ W/cm$^2$ is required while $10^{10}$–$10^{13}$ W/cm$^2$ are usually preferable for the EUV range. Suitable laser systems for this purpose in the visible, ultraviolet and near infra-red wavelength range are commercially available with repetition rates of 10–10000 Hz, and systems having a higher repetition rate are being developed at present.

As pointed out above, the jet may exhibit poor directional stability, thus creating unstable laser-plasma generation. To this end, the tip 10 of the nozzle 6 is heated locally, i.e. close to the nozzle orifice, by some means described below.

The heating of the nozzle tip 10 is preferably local since a general heating of the liquid xenon could result in a spray being formed instead of a spatially continuous jet 2. There are several methods to induce such local heating. One is to resistively heat the tip 10 by applying a thin resitive wire 11

(diameter of a few microns or larger) at the nozzle tip 10 and supply a current through the wire 11. The current, and thus the heating, should be tuned so that the hydrodynamic properties of the flowing liquid xenon inside the nozzle 6 are not markedly changed while the orifice temperature is raised sufficiently to improve the directional stability of the jet 2, presumably by removing evaporation-produced frozen material or fragments on the nozzle orifice. Alternatively, the resistive wire 11 can be exchanged for electrodes (not shown) with proper resistivity that are evaporated at the nozzle tip 10. Other methods of heating the tip 10 include local absorption of cw laser light or other electromagnetic radiation that is focussed on the tip 10. In this context, it is preferred that the outlet is treated to enhance and/or further localize the absorption of the radiation energy, for example by providing an absorbing or conducting arrangement, such as a coating or an antenna (not shown), on the tip 10. Pulsed laser light may also be used, and in this case it cannot be ruled out that any improved directional stability also depends on other factors than just heating, for example ablation of frozen material.

The heating as described above results in sufficient spatial stability (± a few micrometers) to permit laser-plasma production with a laser beam 1' focused to approximately the same size as the diameter of the jet 2.

Figure 2:
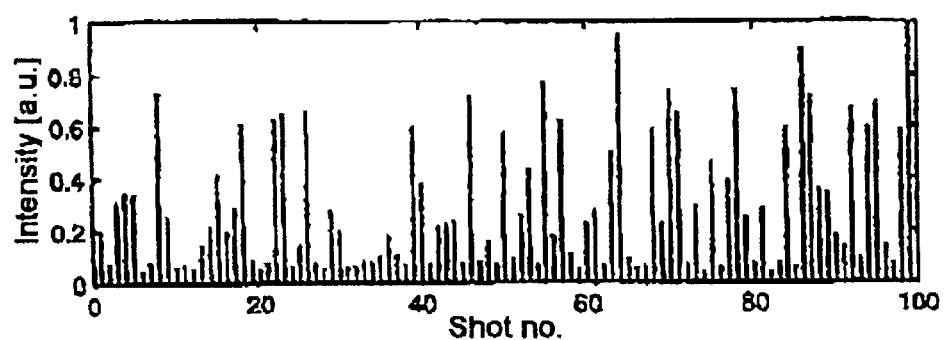
FIG. 2 shows the flux of generated X-ray radiation over time in a prior art apparatus, i.e. without stabilization heating.
Figure 3:
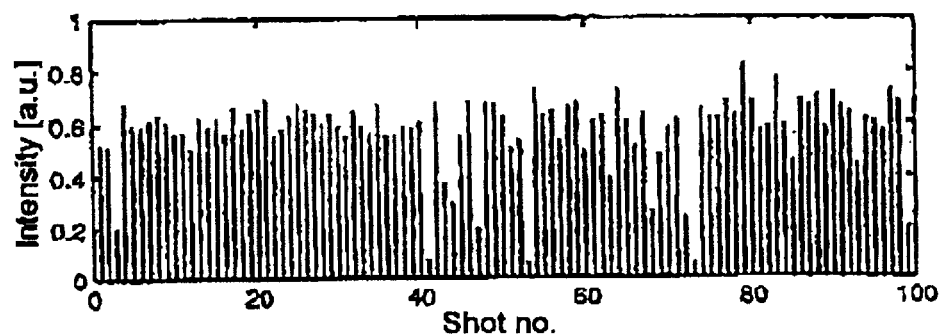
FIG. 3 shows the flux of generated X-ray radiation over time in the apparatus of FIG. 1, i.e. with stabilization heating.

The effectiveness of the invention is further evidenced by the experimental results presented in FIGS. 2 and 3. FIG. 2 shows the flux of the generated radiation over time in an apparatus operating with laser-plasma production from a continuous jet of liquid xenon, but without any heating of the nozzle orifice. FIG. 3 shows the flux of the generated radiation over time in a corresponding apparatus with heating of the nozzle orifice. Evidently, the heating reduces pulse-to-pulse fluctuations in the generated X-ray or EUV radiation flux.

In the embodiment shown in FIG. 1, the laser beam 1' is focused with a spherical lens 12 to a point having a diameter of about five to a few hundred micrometers. Given the speed of the jet 2 of liquid, the main part of the liquid 2 will thus not be used for laser plasma production, which for many liquids results in an increase of pressure in the vacuum chamber 3 owing to evaporation. Low pressure is maintained with a vacuum pump 13, which typically keeps the chamber pressure at $10^{-3}$–$10^{-4}$ mbar during operation. Additional efforts to keep the pressure low may include, for instance, a cold trap (not shown) catching the non-used liquid. Another means is the use of a differential pumping scheme, which also may include recycling of the xenon gas, which is attractive from a cost-of-target perspective. Alternatively (not shown), the nozzle 6 can be positioned outside the main vacuum chamber 3 and inject the jet 2 through a very small aperture. In that case, a mechanical chopper or electric deflection means (not shown) outside the main vacuum chamber 3 can be used to supply merely the desired amount of liquid to the main vacuum chamber 3.

It should be noted that the above-description is only given for the purpose of illustration, and that many modifications are conceivable within the scope of the invention. For example, an elongated laser focus might be formed over a certain length of the jet, for example by means of one or more cylinder lenses (not shown) in combination with one or more spherical lenses, resulting in an elongated EUV emitting plasma. Semicontinuous or pulsed jets of liquid may, within the scope of the invention, be applicable in special cases. This type of jet consists of separate, spatially continuous portions, which are generated by ejecting the liquid through the nozzle during short periods of time only. In contrast to some of the methods described above, this requires some type of valve (not shown) to supply the liquid xenon to the nozzle.

Above, the generation of a directionally stable liquid jet of liquefied gas for laser-plasma production of X-ray and EUV radition has been described by using xenon as an example. Xenon is believed to be especially important due to its high Z (resulting in high conversion efficiency), its inert noble gas character (resulting in minimum damage to sensitive components positioned close to the plasma), and its suitable emission spectrum (that matches the requirements of EUV projection lithography in the wavelength range of 10–15 nm wavelength, and proximity lithography in the wavelength range of 1–2 nm).

Without limiting the invention to any examples, it should be mentioned that other liquefied gases may be used for directionally stable laser-plasma liquid-jet-target operation for other specific applications. Liquid nitrogen has a suitable emission spectrum for water-window X-ray microscopy, see for example the article "Cryogenic liquid-jet target for debris-free laser-plasma soft X-ray generation" by Berglund et al, published in Rev. Sci. Instrum. 69, p. 2361, 1998. Argon emits at a few keV, having potential use in X-ray absorption and fluorescence studies. Oxygen and nitrogen might be used for surface sensitive photoelectron spectroscopy. Heavy target elements, especially in combination with high peak-power lasers, will result in higher energy emission, which may be suitable for, e.g., X-ray diffraction for crystallography or protein-structure determination.

It should be noted that the directional stability of the jet might be improved by other means minimizing the deposition of frozen material on, or close to, the outlet orifice. For example, a protective coating prohibiting any deposition (wetting) of target liquid could be provided on the outlet, preferably close to the outlet orifice. Alternatively, or additionally, the geometrical shape of outlet could be optimized to prohibit such deposition (wetting), For example, the orifice-defining distal end wall of the outlet could be inclined to the longitudinal direction of the outlet. In special cases, these outlet coating/shaping measures could be used without the inventive heating of the outlet.

What is claimed is:

1. A method of generating X-ray or EUV radiation, comprising the steps of: (i) urging a substance through an outlet to generate a jet in a direction from the outlet, (ii) directing at least one energy beam onto the jet, the energy beam interacting with the jet to generate the X-ray or EUV radiation, and (iii) controlling the temperature of the outlet by heating the outlet, such that the stability of the jet is improved, wherein the step of controlling the temperature comprises effecting ohmic heating of the outlet.

2. A method of generating X-ray or EUV radiation, comprising the steps of: (i) urging a substance through an outlet to generate a let in a direction from the outlet, (ii) directing at least one energy beam onto the jet, the energy beam interacting with the let to generate the X-ray or EUV radiation, and (iii) controlling the temperature of the outlet by heating the outlet, such that the stability of the jet is improved, wherein the step of controlling the temperature comprises directing radiation energy onto the outlet.

3. A method as set forth in claim 1 or 2, wherein the jet leaves the outlet in a condensed state.

4. A method as set forth in claim 3, wherein the jet is cooled by evaporation to a frozen state, and the energy beam is directed onto a frozen portion of the jet.

5. A method as set forth in claim 1 or 2, wherein the substance comprises a gas which is cooled to a liquid state before being urged through the outlet.

6. A method as set forth in claim 5, wherein the gas is an essentially inert gas.

7. A method as set forth in claim 6, wherein the gas is a noble gas.

8. A method as set forth in claim 1 or 2, wherein the energy beam is directed onto a spatially continuous portion of the jet.

9. A method as set forth in claim 8, wherein the energy beam is focused to essentially coincide with the spatially continuous portion over a length thereof.

10. A method as set forth in claim 1 or 2, wherein the energy beam is directed onto at least one droplet of the jet.

11. A method as set forth in claim 1 or 2, wherein the energy beam is directed onto a spray of droplets or clusters formed from the jet.

12. A method as set forth in claim 1 or 2, wherein the energy beam comprises pulsed laser radiation which interacts with the jet to form a plasma emitting the X-ray or EUV radiation.

13. A method as set forth in claim 1 or 2, wherein the energy beam is focused on the jet to essentially match a transverse dimension of the energy beam to a transverse dimension of the jet.

14. A method as set forth in claim 1 or 2, wherein X-ray radiation is generated, further comprising the step of performing X-ray microscopy with the radiation.

15. A method as set forth in claim 1 or 2, further comprising the step of performing proximity lithography with the generated radiation.

16. A method as set forth in claim 1 or 2 wherein EUV radiation is generated, further comprising the step of performing EUV projection lithography with the radiation.

17. A method as set forth in claim 1 or 2, further comprising the step of performing photoelectron spectroscopy with the generated radiation.

18. A method as set forth in claim 1 or 2, wherein X-ray radiation is generated, further comprising the step of performing X-ray fluorescence with the radiation.

19. A method as set forth in claim 1 or 2, wherein X-ray radiation is generated, further comprising the step of performing X-ray diffraction with the radiation.

20. A method as set forth in claim 1 or 2, further comprising the step of performing a medical diagnosis with the generated radiation.

21. A method as set forth in claim 1, wherein the step of controlling the temperature comprises effecting ohmic heating of the outlet at an orifice thereof.

22. An apparatus for generating X-ray or EUY radiation, comprising an energy source arranged to emit at least one energy beam; a target generator arranged to urge a substance through an outlet to generate a target in the form of a jet in a direction from the outlet; and a beam controller operative to direct the energy beam emitted by the energy source onto the target jet generated by the target generator, the X-ray or EUV radiation being generated by the energy beam interacting with the jet, the target generator further comprising a temperature controller operative to control the temperature of the outlet by heating the outlet, such that the stability of the target jet is improved, wherein the temperature controller comprises a resistive element arranged in association with the outlet, and a power supply connected to the resistive element to heat the outlet by ohmic heating.

23. An apparatus for generating X-ray or EUV radiation, comprising an energy source arranged to emit at least one energy beam; a target generator arranged to urge a substance through an outlet to generate a target in the form of a jet in a direction from the outlet; and a beam controller operative to direct the energy beam emitted by the energy source onto the target let generated by the target generator, the X-ray or EUV radiation being generated by the energy beam interacting with the jet, the target generator further comprising a temperature controller operative to control the temperature of the outlet by heating the outlet, such that the stability of the target jet is improved, wherein the temperature controller comprises a radiation heater directing radiation energy onto the outlet.

24. An apparatus as set forth in claim 23, wherein the outlet comprises means providing for at least one of enhanced and confined absorption of the radiation energy.

25. An apparatus as set forth in claim 22 or 23, wherein the target generator is adapted to generate the jet such that it is in a condensed state when leaving the outlet.

26. An apparatus as set forth in claim 22 or 23, wherein the substance comprises a gas, the target generator being adapted to cool the gas to a liquid state before urging it through the outlet.

27. An apparatus as set forth in claim 26, wherein the gas is an essentially inert gas.

28. A method as set forth in claim 27, wherein the gas is a noble gas.

29. An apparatus as set forth in claim 22 or 23, wherein the target generator is controllable to provide a spatially continuous portion, at least one droplet, or a spray of droplets or clusters for the energy beam to interact with.

30. An apparatus as set forth in claim 29, wherein the beam controller is adapted to focus the energy beam to essentially coincide with the spatially continuous portion over a length thereof.

31. An apparatus as set forth in claim 22 or 23, wherein the outlet is arranged to generate the jet in a chamber, and wherein a conditioning means is arranged to control the atmosphere in the chamber such that the jet is cooled by evaporation to a frozen state on entry into the chamber.

32. An apparatus as set forth in claim 22 or 23, wherein the energy source comprises a laser emitting at least one beam of pulsed laser radiation, the beam, when directed onto the jet, interacting therewith to form a plasma emitting the X-ray or EUV radiation.

33. An apparatus as set forth in claim 22 or 23, wherein the beam controller is adapted to focus the energy beam on the jet to essentially match a transverse dimension of the energy beam to a transverse dimension of the jet.

* * * * *

UNITED STATES PATENT AND TRADEMARK OFFICE
CERTIFICATE OF CORRECTION

PATENT NO. : 6,760,406 B2
DATED : July 6, 2004
INVENTOR(S) : Hans Martin Hertz et al.

It is certified that error appears in the above-identified patent and that said Letters Patent is hereby corrected as shown below:

<u>Title page,</u>
Insert Item:
-- [30]  Foreign Application Priority Data
Oct. 13, 2000        (SE) ………………………….. 0003715-0 --.

Signed and Sealed this

Sixteenth Day of November, 2004

JON W. DUDAS
*Director of the United States Patent and Trademark Office*